United States Patent
Washino et al.

(10) Patent No.: US 11,121,268 B2
(45) Date of Patent: Sep. 14, 2021

(54) SEMICONDUCTOR LIGHT-RECEIVING ELEMENT AND MANUFACTURING METHOD OF SEMICONDUCTOR LIGHT-RECEIVING ELEMENT

(71) Applicant: Lumentum Japan, Inc., Kanagawa (JP)

(72) Inventors: Ryu Washino, Kanagawa (JP); Hiroshi Hamada, Kanagawa (JP); Takafumi Taniguchi, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/844,757

(22) Filed: Apr. 9, 2020

(65) Prior Publication Data
US 2020/0357937 A1  Nov. 12, 2020

(30) Foreign Application Priority Data
May 7, 2019 (JP) .............................. JP2019-087586

(51) Int. Cl.
*H01L 31/0224* (2006.01)
*H01L 31/18* (2006.01)
*H01L 31/0352* (2006.01)

(52) U.S. Cl.
CPC ............... *H01L 31/022408* (2013.01); *H01L 31/035281* (2013.01); *H01L 31/18* (2013.01)

(58) Field of Classification Search
CPC ........... H01L 31/022408; H01L 31/105; H01L 31/02161; H01L 31/02327; H01L 31/18; H01L 31/035281; H01L 31/0352; H01L 31/101
See application file for complete search history.

(56) References Cited

U.S. PATENT DOCUMENTS

| | | | |
|---|---|---|---|
| 6,586,718 B2 * | 7/2003 | Matsuda | H01L 31/105 250/214.1 |
| 6,635,908 B2 * | 10/2003 | Tanaka | H01L 31/02161 257/186 |
| 6,710,378 B1 * | 3/2004 | Makiuchi | G02B 6/12004 257/184 |
| 6,740,861 B2 * | 5/2004 | Matsuda | H01L 31/105 250/214.1 |

(Continued)

FOREIGN PATENT DOCUMENTS

| | | |
|---|---|---|
| JP | H05-82829 A | 4/1993 |
| JP | 2012-004357 A | 1/2012 |

*Primary Examiner* — Earl N Taylor
(74) *Attorney, Agent, or Firm* — Harrity & Harrity, LLP

(57) ABSTRACT

A semiconductor light-receiving element includes a substrate; a light-receiving mesa portion, formed on top of the substrate, including a first semiconductor layer of a first conductivity type, an absorption layer, and a second semiconductor layer of a second conductivity type; a light-receiving portion electrode, formed above the light-receiving mesa portion, connected to the first semiconductor layer; a pad electrode formed on top of the substrate; and a bridge electrode, placed so that an insulating gap is interposed between the bridge electrode and the second semiconductor layer, configured to connect the light-receiving portion electrode and the pad electrode on top of the substrate, the bridge electrode being formed in a layer separate from layers of the light-receiving portion electrode and the pad electrode.

20 Claims, 10 Drawing Sheets

(56) References Cited

U.S. PATENT DOCUMENTS

| | | | | |
|---|---|---|---|---|
| 2002/0000510 | A1* | 1/2002 | Matsuda | H01L 31/105 250/214.1 |
| 2003/0197115 | A1* | 10/2003 | Matsuda | H01L 31/105 250/214.1 |
| 2003/0222265 | A1* | 12/2003 | Nam | B82Y 20/00 257/85 |
| 2006/0273421 | A1* | 12/2006 | Yasuoka | H01L 31/035281 257/438 |
| 2009/0184311 | A1* | 7/2009 | Steinberg | H01L 29/43 257/9 |
| 2012/0243824 | A1* | 9/2012 | Takabayashi | H01L 31/03046 385/14 |
| 2015/0349206 | A1* | 12/2015 | Lowenthal | H01L 31/028 257/40 |
| 2017/0373471 | A1* | 12/2017 | Kropp | H01L 31/0352 |
| 2020/0357937 | A1* | 11/2020 | Washing | H01L 31/02161 |

* cited by examiner

SEMICONDUCTOR LIGHT-RECEIVING ELEMENT AND MANUFACTURING METHOD OF SEMICONDUCTOR LIGHT-RECEIVING ELEMENT

CROSS-REFERENCE TO RELATED APPLICATION

The present application claims priority from Japanese patent application JP 2019-087586, filed on May 7, 2019, the content of which is hereby incorporated by reference into this application.

TECHNICAL FIELD

The present disclosure relates to a semiconductor light-receiving element and a manufacturing method of a semiconductor light-receiving element.

BACKGROUND

Transmission rates in optical communication are increasing, and an optical module used in optical communication is demanded to be capable of accordingly quick response. Inside the optical module, a semiconductor light-receiving element configured to convert a communicated optical signal into an electric signal is provided. An increased speed is therefore demanded of the semiconductor light-receiving element. A reduction in parasitic capacitance is required in order to improve the response speed of the semiconductor light-receiving element. The semiconductor light-receiving element is driven by sandwiching a light-receiving region including an absorption layer between a p-electrode and an n-electrode, and applying a voltage to the light-receiving region. The p-electrode and the n-electrode are connected to a p-type semiconductor and an n-type semiconductor, respectively.

Parasitic capacitance is caused between the p-type semiconductor and the n-type semiconductor, between the p-electrode and the n-electrode, between the p-electrode and the n-type semiconductor, and other places. The p-electrode includes a light-receiving portion electrode above the light-receiving region, a pad electrode connected to a substrate on which the semiconductor light-receiving element is mounted and to a wire, and a bridge electrode connecting the light-receiving portion electrode and a pad portion. Those electrodes are unitarily formed to form the p-electrode. The width of a part of the bridge electrode is narrowed as a known way to reduce the parasitic capacitance.

A suitable method of forming the electrodes is a so-called lift-off process because a metal film is required to be formed over a plurality of level differences located between the light-receiving portion electrode and the pad electrode. In order to use the lift-off process, a pattern is required to be formed from a resist in a region in which the electrodes are not to be formed. The resist shape required to be used has an opening in a region in which the electrodes are to be formed, and an overhang portion on an upper part of an inner side surface of the opening, to thereby reduce a buildup of a metal film through vapor deposition on the inner side surface of the opening and ensure that the metal film in the region in which the electrodes are to be formed and the metal film in the region in which the electrodes are not to be formed are separable from each other when the resist is removed. However, the overhang portion is deformed in the forming of the metal film through vapor deposition due to heat and stress held in the metal film, and the deformation widens the resist opening region to cause the formed bridge electrode to be wider than a desired width. The resultant problem is an increase in parasitic capacitance generated between a semiconductor layer that is included in a light-receiving mesa portion and the bridge electrode.

The present disclosure has been made in view of the problem described above, and an object of the present disclosure is therefore to suppress the generation of parasitic capacitance between a semiconductor layer included in a light-receiving mesa portion and a bridge electrode.

SUMMARY

According to some possible implementations, a semiconductor light-receiving element includes a substrate; a light-receiving mesa portion, formed on top of the substrate, including a first semiconductor layer of a first conductivity type, an absorption layer, and a second semiconductor layer of a second conductivity type; a light-receiving portion electrode, formed above the light-receiving mesa portion, connected to the first semiconductor layer; a pad electrode formed on top of the substrate; and a bridge electrode, placed so that an insulating gap is interposed between the bridge electrode and the second semiconductor layer, configured to connect the light-receiving portion electrode and the pad electrode on top of the substrate, the bridge electrode being formed in a layer separate from layers of the light-receiving portion electrode and the pad electrode.

According to some possible implementations, a manufacturing method of a semiconductor light-receiving element includes preparing a substrate; forming a light-receiving mesa portion on top of the substrate, the light-receiving mesa portion including a first semiconductor layer of a first conductivity type, an absorption layer, and a second semiconductor layer of a second conductivity type; forming a light-receiving portion electrode above the light-receiving mesa portion, the light-receiving portion electrode being connected to the first semiconductor layer; forming a pad electrode on top of the substrate; and forming a bridge electrode in a layer separate from layers of the light-receiving portion electrode and the pad electrode, the bridge electrode being placed so that an insulating gap is interposed between the bridge electrode and the second semiconductor layer, and the bridge electrode connecting the light-receiving portion electrode and the pad electrode on top of the substrate, wherein the forming the bridge electrode includes: forming a resist that has, when viewed from above the substrate, an opening in a region in which the bridge electrode is to be formed and an overhang portion on an inner side surface of the opening; forming a metal film by vapor deposition on a top surface of the resist and in the region in which the bridge electrode is to be formed; and removing the resist to remove a portion of the metal film that is formed on the top surface of the resist.

DETAILED DESCRIPTION

The following detailed description of example implementations refers to the accompanying drawings. The same reference numbers in different drawings may identify the same or similar elements.

Figure 1:
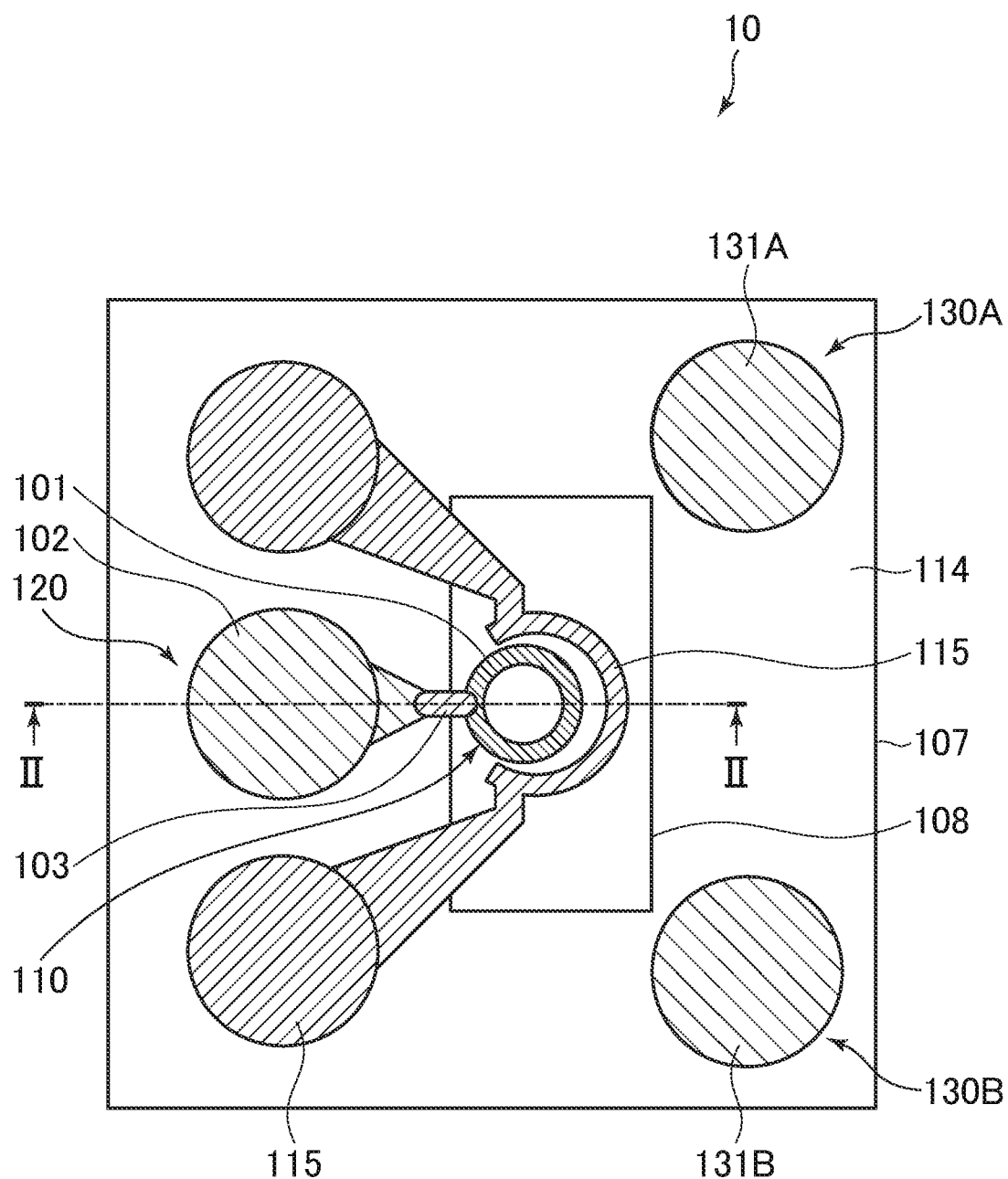
FIG. 1 is a schematic plan view for illustrating a top surface of a semiconductor light-receiving element according to an example.
Figure 2:
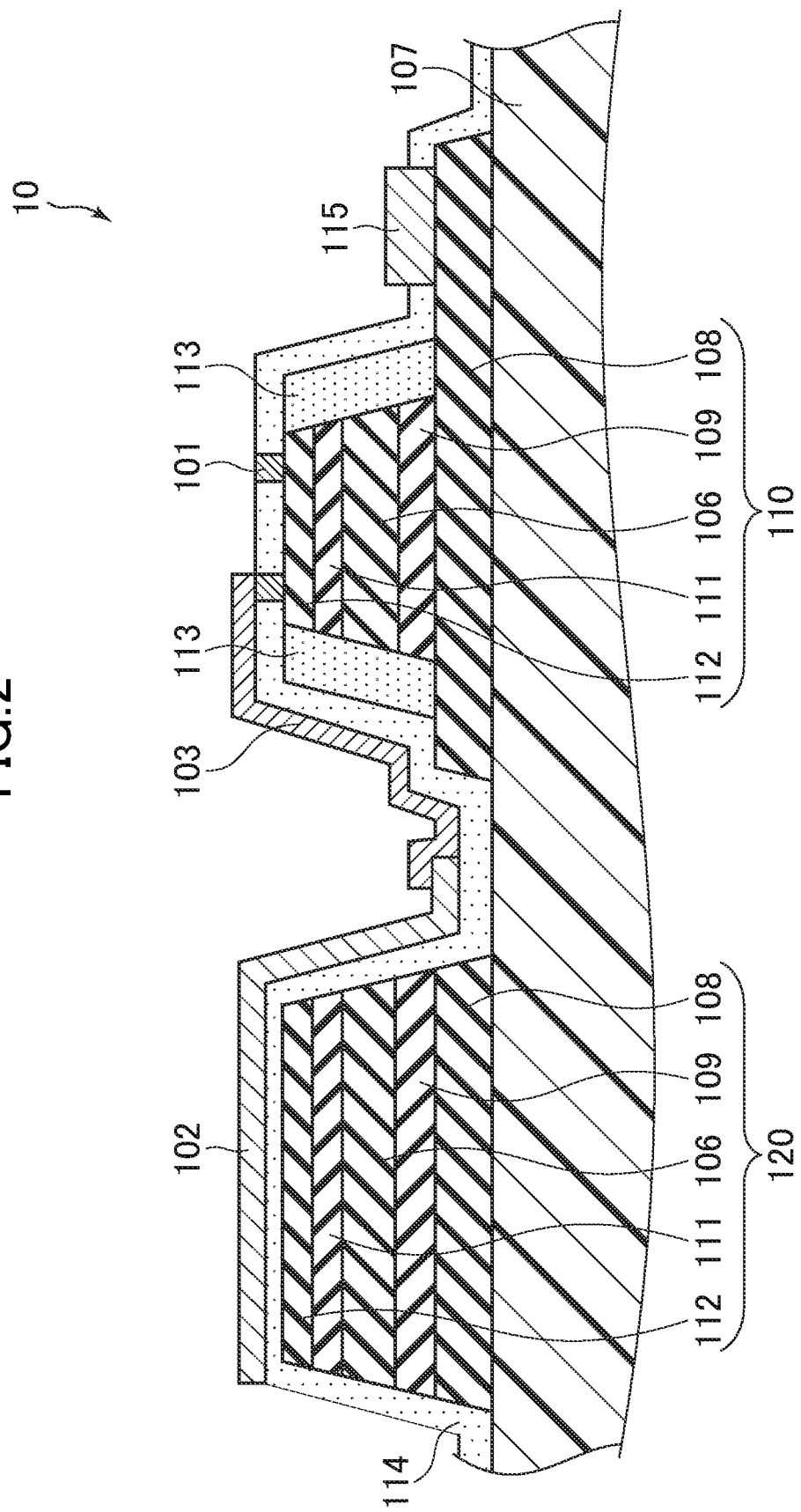
FIG. 2 is a schematic sectional view taken along the line II-II of FIG. 1.

FIG. 1 is a schematic plan view for illustrating a top surface of a semiconductor light-receiving element 10 according to an implementation. FIG. 2 is a schematic sectional view taken along the line II-II of FIG. 1. As illustrated in FIG. 1 and FIG. 2, the semiconductor light-receiving element 10 according to an implementation includes a light-receiving mesa portion 110, a pad mesa portion 120, and two dummy mesa portions, 130A and 130B, which are formed above a semi-insulating substrate 107, which is made of InP and doped with, for example, Fe. The semiconductor light-receiving element 10 according to an example that is illustrated in FIG. 1 and FIG. 2 is a front-illuminated semiconductor light-receiving element in which light enters from a top side of the light-receiving mesa portion 110. Light incident on this semiconductor light-receiving element 10 passes through a passivation film 114, which is a low-reflection film, and enters an absorption layer 106 of the light-receiving mesa portion 110 to be absorbed and converted into electricity.

As illustrated in FIG. 2, the light-receiving mesa portion 110 includes an n-type contact layer 108, which is a second semiconductor layer of a second conductivity type, an n-type buffer layer 109 formed above the n-type contact layer 108, an absorption layer 106, which is made from an i-type semiconductor and formed above the n-type buffer layer 109, a p-type buffer layer 111 formed above the absorption layer 106, and a p-type contact layer 112, which is a first semiconductor layer of a first conductivity type and is formed above the p-type buffer layer 111. According to an implementation, the light-receiving mesa portion 110 further includes a semi-insulating embedded layer 113, which is made of Fe—InP and placed so as to cover side surfaces of some of the layers described above, from the n-type buffer layer 109 to the p-type contact layer 112.

The pad mesa portion 120 has the same layer structure as that of the light-receiving mesa portion 110, except that the embedded layer 113 is not included in the pad mesa portion 120. The dummy mesa portions 130A and 130B have the same layer structure as that of the pad mesa portion 120.

The light-receiving mesa portion 110, the pad mesa portion 120, and the dummy mesa portions 130A and 130B can be formed by, for example, growing the layer structures described above with the use of a metal organic chemical vapor deposition (MOCVD) apparatus, and then separating the layer structures from one another with the use of a lithography technology. Dummy electrodes 131A and 131B, which are not connected electrically and physically to other electrodes and to the light-receiving mesa portion 110, are formed on top surfaces of the dummy mesa portions 130A and 130B, respectively.

As illustrated in FIG. 1 and FIG. 2, the passivation film 114 is formed on all exposed surfaces of the light-receiving mesa portion 110, the pad mesa portion 120, and the substrate 107 to protect all the exposed surfaces with the passivation film 114. The passivation film 114 is a low-reflection film with respect to the wavelength (a 1.3-μm band or a 1.55-μm band) of light incident on the semiconductor light-receiving element 10, and is also an insulating film. However, in a configuration illustrated in FIG. 2, the passivation film 114 is not formed in a region above the n-type contact layer 108 in which an n-electrode 115 is to be formed and a region above the light-receiving mesa portion 110 in which a light-receiving portion electrode 101 is to be formed. In other words, the configuration gives the passivation film 114 through-holes in the region in which the n-electrode 115 is to be formed and the region in which the light-receiving portion electrode 101 is to be formed. In the configuration illustrated in FIG. 2, the passivation film 114 is formed from a region under a bridge electrode 103, which is described later, to a region under a pad electrode 102 to insulate the bridge electrode 103 and the pad electrode 102 from layers under the passivation film 114.

The light-receiving portion electrode 101 is formed above the light-receiving mesa portion 110 and is connected to the p-type contact layer 112, which is the first semiconductor layer. In the example illustrated in FIG. 1 and FIG. 2, the passivation film 114 has a ring-shaped through-hole in a top surface of the light-receiving mesa portion 110, and the light-receiving portion electrode 101 is formed in the through-hole.

The pad electrode 102 is placed on top of the substrate 107 and the pad mesa portion 120 is interposed between the substrate 107 and the pad electrode 102. When viewed from above the substrate 107, the pad electrode 102 is placed to stretch from a region in which the pad mesa portion 120 is not placed, climb along a sloped surface of the pad mesa portion 120, and spread over a top surface of the pad mesa portion 120.

As illustrated in FIG. 1 and FIG. 2, the bridge electrode 103 connecting the light-receiving portion electrode 101 and the pad electrode 102 is also placed on top of the substrate 107. The bridge electrode 103 is directly connected to the light-receiving portion electrode 101, and is placed to stretch along a sloped surface of the light-receiving mesa portion 110 and reach a region in which the n-type contact layer 108 that is a lower part of the light-receiving mesa portion 110 is not placed.

The light-receiving portion electrode 101, the pad electrode 102, and the bridge electrode 103 form a p-electrode.

In this configuration, parasitic capacitance is generated mainly in, for example, a region between the p-type buffer layer 111 and the n-type buffer layer 109 and a region between the bridge electrode 103 and the n-type contact layer 108. The passivation film 114, which is an insulating film, is interposed between the bridge electrode 103 and the n-type contact layer 108 to serve as an insulating gap, and parasitic capacitance is consequently generated between the bridge electrode 103 and the n-type contact layer 108. Parasitic capacitance is not generated in a region in which an n-side conductive region is insulated from others. Dominant causes of the generation of parasitic capacitance between the p-type buffer layer 111 and the n-type buffer layer 109 are the thickness and planar dimensions of the absorption layer 106. The size of the absorption layer 106, however, affects other characteristics including light-receiving sensitivity, and therefore cannot be changed freely. In the region between the bridge electrode 103 and the n-type contact layer 108, on the other hand, there is no fear of affecting other optical characteristics. The widening of the bridge electrode 103 is therefore inhibited in an implementation in order to reduce parasitic capacitance.

The bridge electrode 103 is formed in a layer separate from layers of the light-receiving portion electrode 101 and the pad electrode 102. More specifically, the bridge electrode 103 is formed in a layer above the light-receiving portion electrode 101, and above or below the pad electrode 102. The reason therefor is described below with reference to FIG. 6 to FIG. 10.

Figure 6:
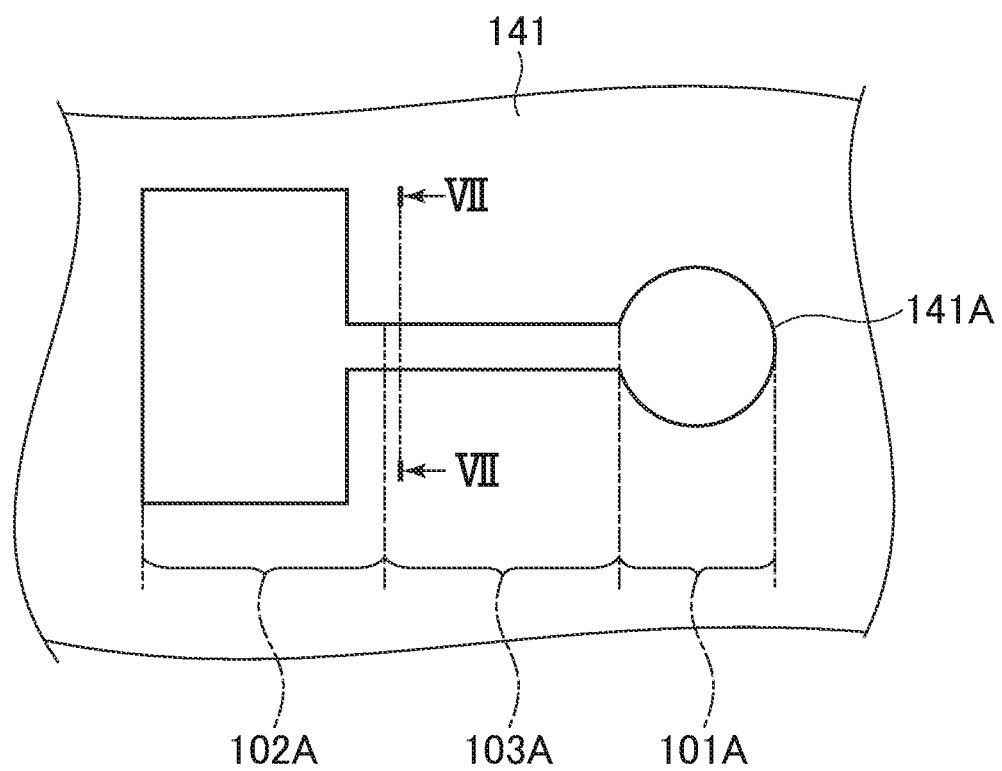
FIG. 6 is a schematic top view for illustrating a shape of a resist that is used in a method of manufacturing a semiconductor light-receiving element according to an example.
Figure 7:
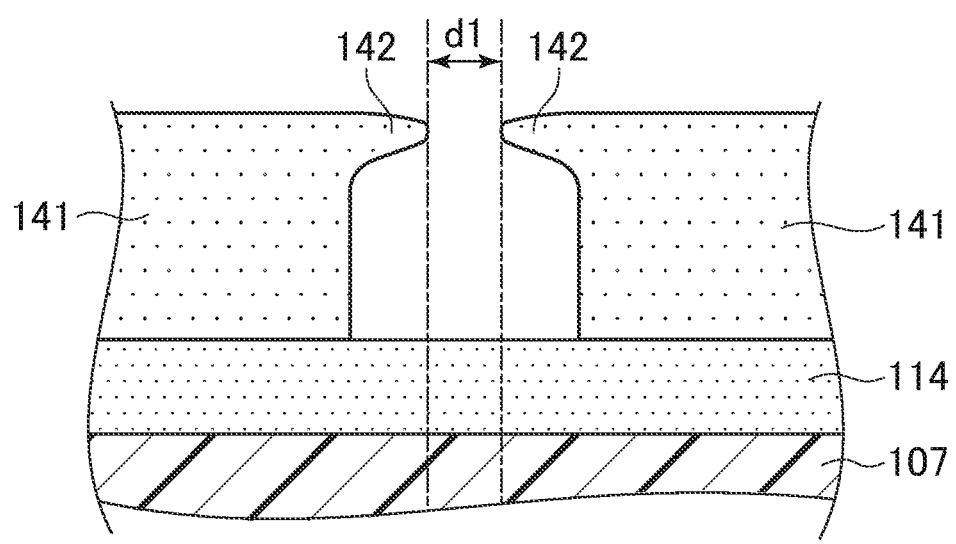
FIG. 7 is a schematic sectional view taken along the line VII-VII of FIG. 6.

FIG. 6 is a schematic top view for illustrating a shape of a resist that is used in a method of manufacturing a semiconductor light-receiving element according to a comparative example of this disclosure. FIG. 7 is a schematic sectional view taken along the line VII-VII of FIG. 6. When the light-receiving portion electrode 101, pad electrode 102, and bridge electrode 103 described above are to be formed in a single step, a resist 141 as the one illustrated in FIG. 6 is formed. The resist 141 is patterned by applying the resist 141 to the entire top side of the substrate 107, baking, and performing exposure and development with the use of a photomask.

The resist 141 has an opening 141A corresponding to a desired electrode pattern, which includes the light-receiving portion electrode 101, pad electrode 102, and bridge electrode 103 described above. That is, a region 101A in which the light-receiving portion electrode 101 is to be formed, a region 102A in which the pad electrode 102 is to be formed, and a region 103A in which the bridge electrode 103 is to be formed are contained inside the opening 141A.

As illustrated in FIG. 7, the resist 141 also has an overhang portion 142 on an inner side surface of the opening 141A. The resist 141 may be a positive resist or a negative resist. A negative resist, however, is preferred in terms of the forming of the overhang portion 142 described above.

Figure 8:
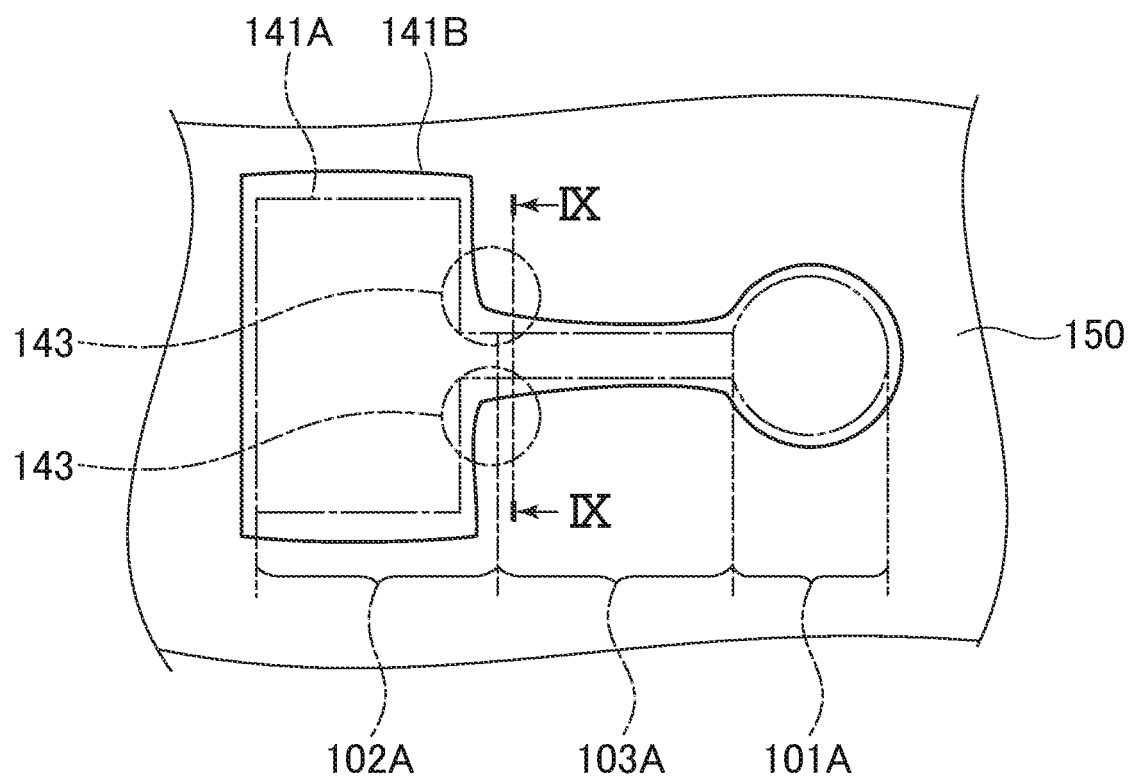
FIG. 8 is a schematic top view for illustrating a state in which a metal film is formed through vapor deposition on a resist that is used in the method of manufacturing a semiconductor light-receiving element according to an example.
Figure 9:
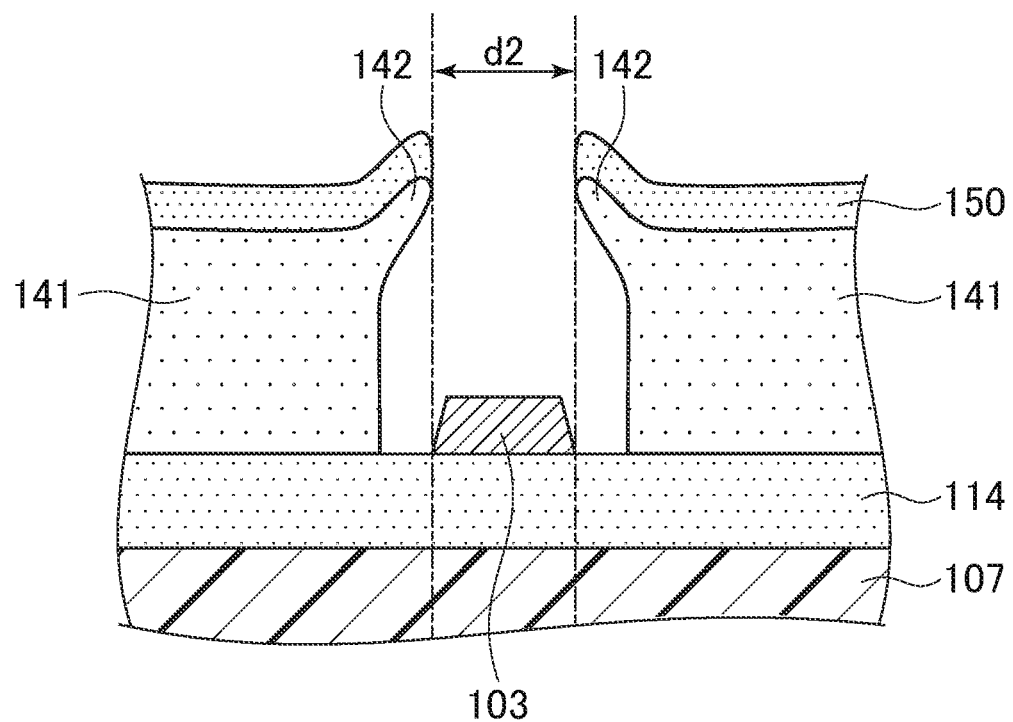
FIG. 9 is a schematic sectional view taken along the line IX-IX of FIG. 8.

A metal film is formed by vapor deposition on a top surface of the resist 141 and on top of the substrate 107 (a top surface of the passivation film 114) that is exposed in the opening 141A. The resist 141 is then removed to remove the metal film formed on the top surface of the resist 141, and a desired electrode pattern is formed by this removal of the metal film. FIG. 8 is a schematic top view for illustrating a state in which a metal film is formed by vapor deposition on a resist that is used in the method of manufacturing a semiconductor light-receiving element according to the comparative example of this disclosure. FIG. 9 is a schematic sectional view taken along the line IX-IX of FIG. 8. As illustrated in FIG. 8 and FIG. 9, an opening 141B in the forming of a metal film 150 by vapor deposition is wider than the opening 141A corresponding to the desired pattern. This is because, as illustrated in FIG. 9, the overhang portion 142 is deformed by radiation heat emitted from the portion of the metal film 150 that is formed on the top surface of the resist 141, and by stress held in the metal film 150. A width d2 of the opening 141B illustrated in FIG. 9 is consequently wider than a width d1 of the opening 141A illustrated in FIG. 7.

When the widening of the opening 141B accompanies the deformation of the overhang portion 142 of the resist 141 in the regions 101A, 102A, and 103A illustrated in FIG. 6 and FIG. 8, deformation in the regions 101A, 102A, and 103A affect one another because the regions 101A, 102A, and 103A are linked. That is, stress caused by the deformation of the overhang portion 142 that occurs in the regions 101A and 102A is applied to the region 103A in which the bridge electrode 103 is to be formed. The amount of deformation is particularly large in the region 102A in which the pad electrode 102 is to be formed and the region 101A in which the light-receiving portion electrode 101 is to be formed, because the regions 101A and 102A are larger in planar dimensions than the region 103A in which the bridge electrode 103 is to be formed.

The opening 141A (141B) also has a region 143 widening outward, and the amount of deformation of the overhang portion 142 is even larger in the region 143. The large amount of deformation affects the region 103A linked to the region 143, by increasing the amount of deformation of the overhang portion 142 of the resist 141 in the region 103A.

As a result, the width d2 of the opening 141B of the resist 141 in the region 103A in which the bridge electrode 103 is to be formed becomes wider than the width d1 of the opening 141A prior to the forming of the metal film 150, and the actually formed bridge electrode 103 is accordingly wider than the desired width. Parasitic capacitance is generated between the bridge electrode 103 and the n-type contact layer 108 that is included in the light-receiving mesa portion 110, via the passivation film 114, which is an insulating film. The increase in the width of the bridge electrode 103 is therefore accompanied by an increase in parasitic capacitance generated between the bridge electrode 103 and the n-type contact layer 108.

Figure 10:
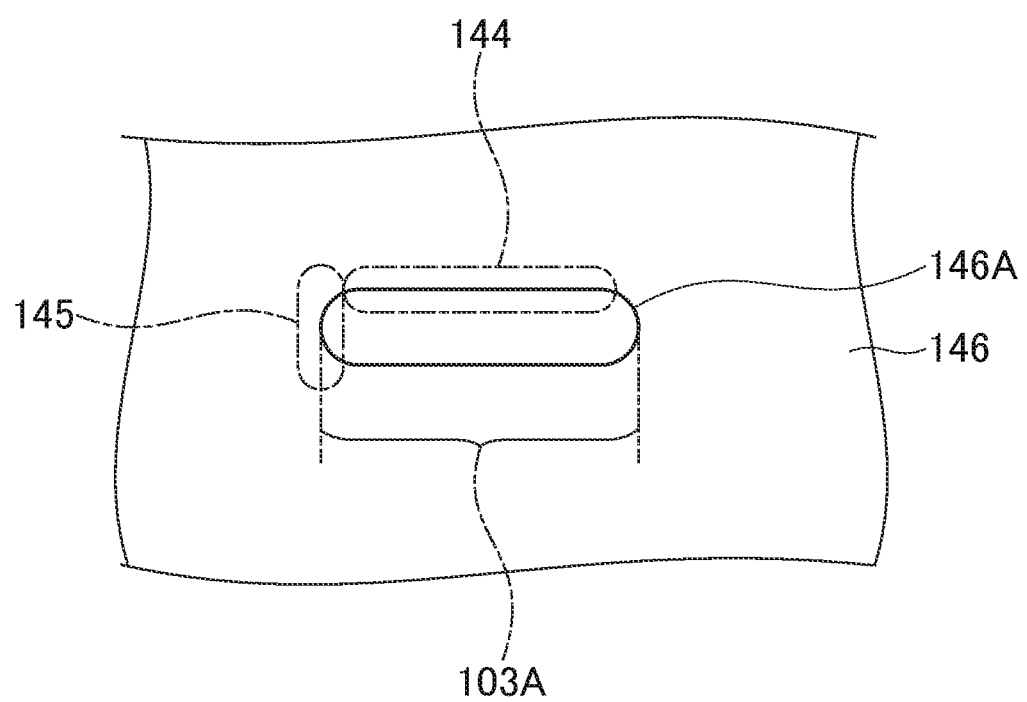
FIG. 10 is a schematic top view for illustrating a shape of a resist that is used in a step of forming a bridge electrode.

The above implementation addresses this problem by separating a step of forming the bridge electrode 103 from a step of forming the light-receiving portion electrode 101 and a step of forming the pad electrode 102. FIG. 10 is a schematic top view for illustrating a shape of a resist 146, which is a resist used in the step of forming the bridge electrode 103. The resist 146 illustrated in FIG. 10 is similar to the resist 141 illustrated in FIG. 7 in that an overhang portion is included. According to an implementation, the bridge electrode 103 alone is separately formed, and the resist 146 having an opening 146A, which corresponds to only the region 103A for forming the bridge electrode 103 as illustrated in FIG. 10, can accordingly be used. The resist 146 used in the forming of the bridge electrode 103 is therefore not affected by deformation of the overhang portion of the resist 146, which is caused when the light-receiving portion electrode 101 and the pad electrode 102 are formed in a step of forming the metal film by vapor deposition.

Consequently, the opening 146A of the resist 146 is kept from increasing in width, and the widening of the bridge electrode 103 formed on top of the substrate 107 after the resist 146 is removed is inhibited. The generation of parasitic capacitance between the bridge electrode 103 and the n-type contact layer 108 can thus be suppressed.

The bridge electrode 103 formed by this manufacturing method is accordingly in a layer separate from the layers of the light-receiving portion electrode 101 and the pad electrode 102 as described above. More specifically, the bridge electrode 103 is formed in a layer above the light-receiving portion electrode 101, and above the pad electrode 102. The bridge electrode 103 may be formed below the pad electrode 102.

The effect described above is particularly notable when, as illustrated in FIG. 2, there are a plurality of level differences in the region in which the bridge electrode 103 is formed, and which stretches from the light-receiving portion electrode 101 to the pad electrode 102. For example, a case in which the resist 141 having the opening 141A as the one illustrated in FIG. 6 is formed is considered. In this case, when the exposure amount is adjusted so that the overhang portion 142 is formed in an optimum amount in the region 101A in which the light-receiving portion electrode 101 having a complicate shape is to be formed, there is a possibility that the overhang portion 142 formed in the region 103A in which the bridge electrode 103 is to be formed ends up being wider than the overhang portion 142 in the region 101A. This is because the depth in a light exposure direction in the region 103A differs from that in the region 101A. As a result, the overhang portion 142 in the region 103A may significantly be changed in shape by thermal stress applied in the forming of the metal film through vapor deposition, or by stress. According to an implementation, however, the forming of the resist 146 corresponding only to the region 103A in which the bridge electrode 103 is to be formed as described above enables an adjustment of the exposure amount that is suited to the depth of the region 103A, and an overhang portion of an appropriate width can accordingly be formed. The significant change in shape of the overhang portion in the region 103A due to thermal stress applied in the forming of the metal film by vapor deposition, or stress, is consequently inhibited, and the formed bridge electrode 103 can be kept from increasing in width.

In addition, the opening 146A can have an inwardly closed shape when viewed from above the substrate 107 because the opening 146A in the resist 146 corresponds only to the region 103A in which the bridge electrode 103 is to be formed. The inwardly closed shape is a shape in which all lines tangent to the contour of the opening 146A are circumscribed and include no inscribed lines. With this configuration, the opening 146A does not have the region 143 widening outward as the one illustrated in FIG. 8, and is thus kept from widening. For example, deformation of an overhang portion that is formed in a linear region 144 in the opening 146A illustrated in FIG. 10 is inhibited by a curved region 145 linked to the linear region 144. Deformation of an overhang portion that is formed in the curved region 145 is inhibited by the linear region 144 linked to the curved region 145. The bridge electrode 103 formed on top of the substrate 107 after the lift-off process is subsequently performed has a shape inwardly closed as the opening 146A does. That is, the bridge electrode 103 has a shape in which all lines tangent to the contour of the bridge electrode 103 are circumscribed and include no inscribed line when viewed from above the substrate 107.

A desired contour of the opening 146A of the resist 146 when viewed from above the substrate 107 is a combination of at least one type of elements selected from straight lines, curved lines, and obtuse angles, because this shape prevents thermal stress in the forming of the metal film 150 by vapor deposition, or stress, from locally concentrating on the resist 146. The formed bridge electrode 103 consequently has a contour that is a combination of at least one type of elements selected from straight lines, curved lines, and obtuse angles as well.

A desired point at which the bridge electrode 103 and the pad electrode 102 are connected is closer to the pad electrode 102 than to a region in which the n-type contact layer 108 as the second semiconductor layer is placed, when viewed from above the substrate 107. That is, the region in which the n-type contact layer 108 is placed and the pad electrode 102 do not overlap with each other when viewed from above the substrate 107 in a desired configuration. With this configuration, only the bridge electrode 103 that is kept from increasing in width by the manufacturing method described above is placed in a region that overlaps with the n-type contact layer 108, and the pad electrode 102 is not placed in the region when viewed from above the substrate 107, to suppress the generation of parasitic capacitance between the pad electrode 102 and the n-type contact layer 108.

According to an implementation, the light-receiving portion electrode 101 has a first layer structure including three layers. The three layers are, from the side close to the p-type contact layer 112, a Ti layer, which is a first close contact electrode, a Pt layer, which is a barrier electrode, and a Au layer, which is a first conducting electrode. Au is desired for the first conducting electrode from the viewpoint of current conduction properties and heat dissipation properties. However, diffused Au may reach as far as the p-type contact layer 112. When diffused Au reaches the interior of the p-type contact layer 112, reliability drops. It is therefore desired to place the Pt layer as a barrier electrode between the Au layer and the p-type contact layer 112, so that the diffusion of Au into the p-type contact layer 112 is prevented. However, the adhesion of the Pt layer to the p-type contact layer 112, which is a semiconductor, is poor and there is a worry that the electrode may be detached. The Ti layer highly connective to semiconductors is therefore placed below the Pt layer.

The bridge electrode 103, on the other hand, has a second layer structure including two layers. The two layers are, from the side close to the p-type contact layer 112, a Ti layer, which is a second close contact electrode, and a Au layer, which is a second conducting electrode. In short, the second layer structure of the bridge electrode 103 does not have a Pt layer serving as a barrier electrode, unlike the first layer structure of the light-receiving portion electrode 101. This configuration further inhibits the widening of the bridge electrode 103. Generally speaking, Pt is high in radiant heat and stress, and also has a high ratio of shrinkage accompanying a temperature change. Accordingly, the Pt layer greatly affects the deformation of the overhang portion of the resist 146 in the step of forming the metal film 150 to the entire surface described above. The barrier electrode, which is made of Pt having those characteristics, is excluded from the second layer structure, to thereby keep the width of the opening 146A in the resist 146 from increasing and inhibit the widening of the bridge electrode 103 formed on top of the substrate 107. In addition, with the second layer structure having one less electrode layer, the metal film 150 can be formed in a reduced time, and the effect of keeping the width of the opening 146A in the resist 146 from increasing can be obtained. The second layer structure does not require the barrier electrode also because the passivation film 114 described above is interposed between the bridge electrode 103 and the light-receiving mesa portion 110, and Au contained in the second conducting electrode is accordingly prevented from diffusing to the semiconductor layers included in the light-receiving mesa portion 110. The Pt layer as the barrier electrode is therefore desired to be excluded from the second layer structure of the bridge electrode 103. Adhesion between the Au layer and an insulating film is poor, and the bridge electrode 103 is therefore preferred to include the Ti layer as a close contact electrode in order to keep the electrode from being detached.

The first close contact electrode and the second close contact electrode may be a metal other than Ti as long as the metal's adhesion to an insulating film is superior to that of Au, and may be W, Cr, Pd, Ta, or the like. The barrier electrode included in the first layer structure is not limited to Pt and may be Mo. The first conducting electrode and the second conducting electrode are not limited to Au and may be an alloy containing Au. The first layer structure of the light-receiving portion electrode 101 may have two layers of first close contact electrode and two layers of first barrier electrode. That is, the first layer structure may be a five-layer structure including, from the side close to the p-type contact layer 112, a Ti layer, a Pt layer, another Ti layer, another Pt layer, and a Au layer. It is sufficient for the first layer structure to have a configuration in which the first close contact electrode is in contact with the p-type contact layer 112 and a barrier electrode containing Pt or a similar metal is sandwiched between the first conducting electrode, which is the topmost layer containing Au, and the first close contact electrode.

The bridge electrode 103 is preferred to have a width of 2 μm or more and 7 μm or less in a direction orthogonal to a direction in which the bridge electrode 103 stretches, in a region that overlaps with the light-receiving mesa portion 110, when viewed from above the substrate 107. A width of 2 μm or more is preferred from the viewpoint of low power consumption because the bridge electrode 103 having this width can be reduced in resistance value, which keeps the operating voltage from increasing. Parasitic capacitance generated between the bridge electrode 103 and the light-receiving mesa portion 110 can be reduced by setting the width of the bridge electrode 103 to 7 μm or less, which enables adaptation to high-speed operation as high as 25 Gbps or higher.

The pad electrode 102 may have the same layer structure as one of the layer structures of the bridge electrode 103 and the light-receiving portion electrode 101, but is not formed by the same process as that of the bridge electrode 103 in order to inhibit the widening of the bridge electrode 103 as described above. From the viewpoint of process simplification, the n-electrode 115 and the pad electrode 102 may be formed by the same process to have the same configuration. The pad electrode 102 may have a five-layer structure that includes, for example, a AuGe layer, a Ni layer, a Ti layer, a Pt layer, and a Au layer from the side close to the p-type contact layer 112. This five-layer structure is preferred from the viewpoint of ohmic contact to the n-type contact layer 108.

A method of manufacturing the semiconductor light-receiving element 10 is described below.

(Structural Layer Growth Step) First, an MOCVD apparatus or the like is used to grow, on the entire top surface of the substrate 107, a structural layer that includes the n-type contact layer 108, n-type buffer layer 109, absorption layer 106, p-type buffer layer 111, and p-type contact layer 112 described above.

(Mesa Structure Forming Step) Next, a lithography technology is used to form the light-receiving mesa portion 110, the pad mesa portion 120, and the dummy mesa portions 130A and 130B by separation from the structural layer described above.

(Passivation Film Forming Step) The passivation film 114, which is an insulating oxide film, is then formed on the entire top side of the substrate 107. A film functioning as a low-reflection film with respect to the wavelength (a 1.3-μm band or a 1.55-μm band) of light incident on the semiconductor light-receiving element 10 is used as the passivation film 114.

(Passivation Film Processing Step) Next, a ring-shaped through-hole is formed in a region of the passivation film 114 in which the light-receiving portion electrode 101 is to be formed on the top surface of the light-receiving mesa portion 110, to expose the p-type contact layer 112 from under the passivation film 114. Another through-hole is formed in a region in which the n-electrode 115 is to be formed on a top surface of the n-type contact layer 108, to expose the n-type contact layer 108 from under the passivation film 114.

(Light-receiving Portion Electrode Forming Step) The light-receiving portion electrode 101 is then formed in the through-hole in the passivation film that is formed on the top surface of the light-receiving mesa portion 110. The light-receiving portion electrode 101 can be formed by the resist application process, metal film vapor deposition process, and lift-off process described above. Specifically, a resist is formed in the entire region in which the light-receiving portion electrode 101 is not to be formed, and a metal film is formed by vapor deposition on the top surface of the resist and in a region in which the light-receiving portion electrode 101 is to be formed. The resist is subsequently removed, to thereby remove the portion of the metal film that is formed on the top surface of the resist. The light-receiving portion electrode 101 is thus formed.

A metal film of the light-receiving portion electrode 101 is formed by a vapor deposition process in which Ti is deposited first by vapor deposition to form a film having a thickness of 10 nm to 50 nm as the first close contact electrode, Pt is deposited next by vapor deposition to form a film having a thickness of 25 nm to 50 nm as the barrier electrode, and then Au is deposited by vapor deposition to form a film having a thickness of 200 nm to 1 μm as the first conducting electrode.

(Pad Electrode, n-Electrode, Dummy Electrode Forming Step) Next, the pad electrode 102, n-electrode 115, and dummy electrodes 131A and 131B described above are formed. The pad electrode 102, the n-electrode 115, and the dummy electrodes 131A and 131B can be formed by using the resist application process, the metal film vapor deposition process, and the lift-off process as in the light-receiving portion electrode forming step. The pad electrode, n-electrode, dummy electrode forming step may be executed before, at the same time as, or after the light-receiving portion electrode forming step described above, but not at the same time as a bridge electrode forming step described below.

(Bridge Electrode Forming Step) The bridge electrode 103 is formed next. The method of forming the bridge electrode 103 is as described above with reference to FIG. 10, and a description thereof is omitted here. The bridge electrode forming step may be executed before the pad electrode, n-electrode, dummy electrode forming step described above.

A metal film of the bridge electrode 103 is formed by a vapor deposition process in which Ti is deposited first by vapor deposition to form a film having a thickness of 10 nm to 50 nm as the second close contact electrode, and then Au is deposited by vapor deposition to form a film having a thickness of 200 nm to 1 μm as the second conducting electrode.

(Chipping Step) Lastly, a group of semiconductor light-receiving elements is chipped into pieces to obtain the semiconductor light-receiving element 10 as an individual piece. In the chipping step, it is not always required to chip so that a single semiconductor light-receiving element 10 is obtained, and a group of semiconductor light-receiving elements may be chipped into, for example, semiconductor light-receiving element groups each including a plurality of semiconductor light-receiving elements 10 that are arranged in an array pattern.

The semiconductor light-receiving element 10 can be manufactured through the steps described above.

A semiconductor light-receiving element 10B according to another example is described next with reference to FIG. 3 and FIG. 4.

Figure 3:
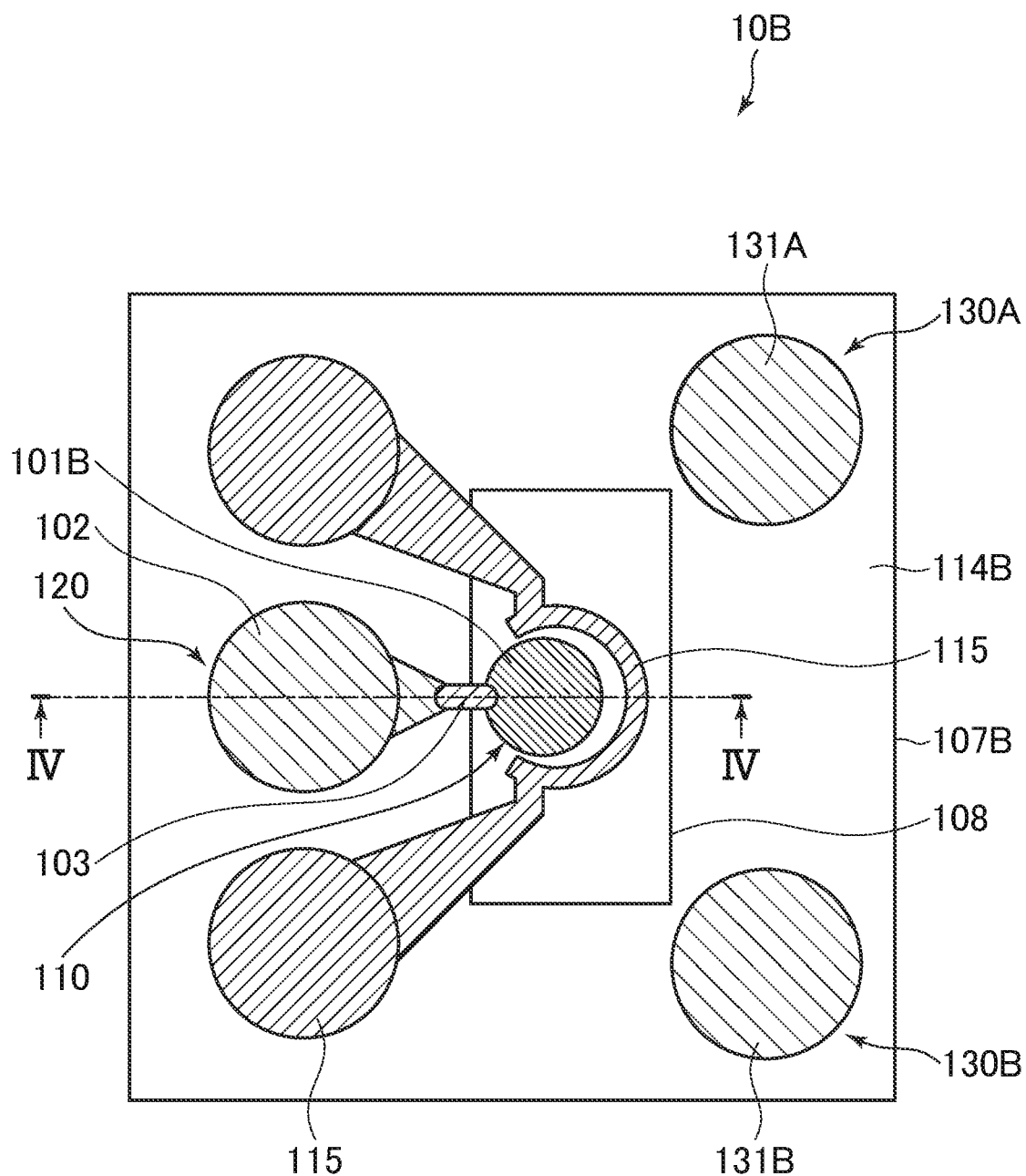
FIG. 3 is a schematic plan view for illustrating a top surface of a semiconductor light-receiving element according to an example.
Figure 4:
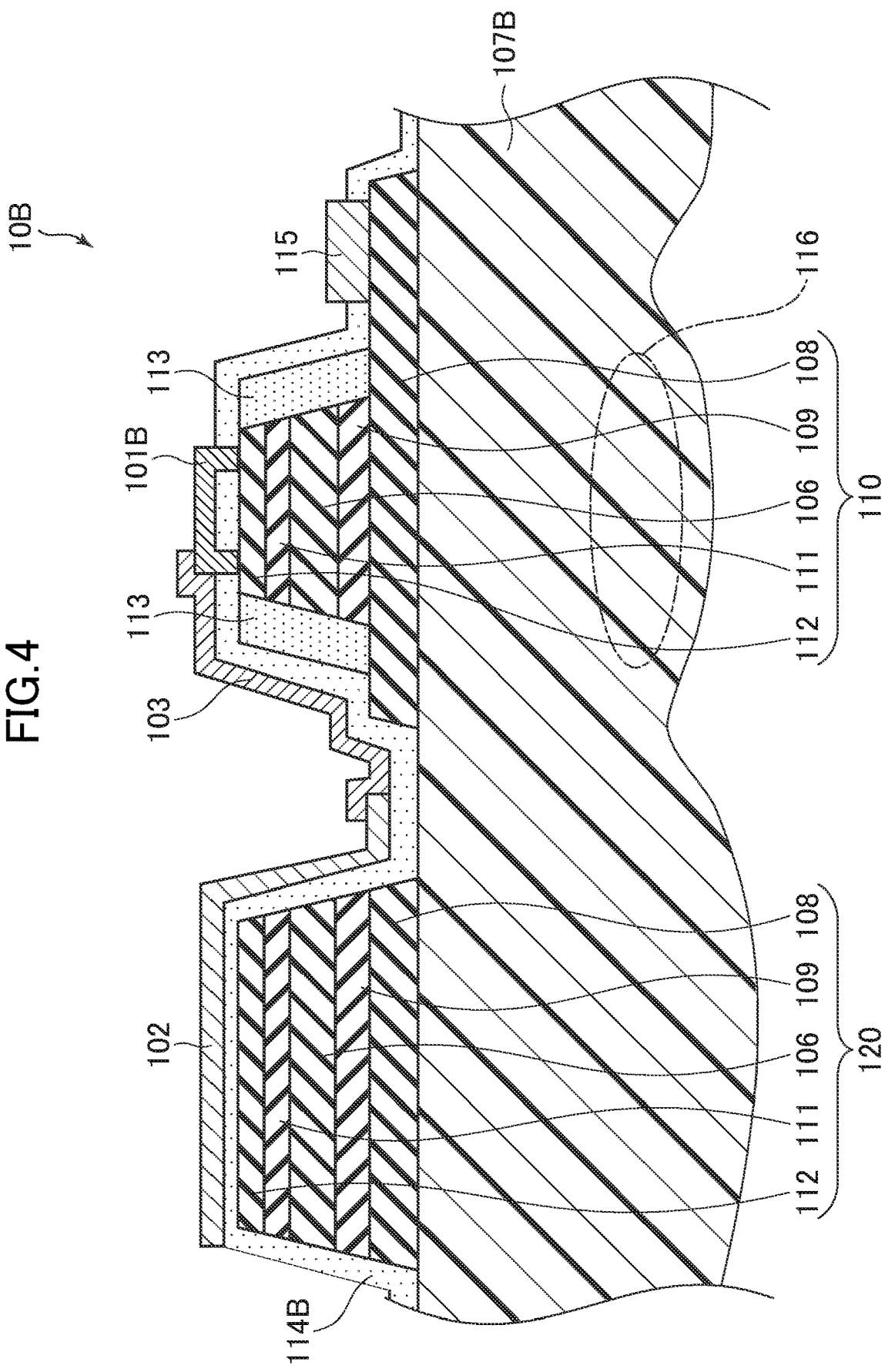
FIG. 4 is a schematic sectional view taken along the line IV-IV of FIG. 3.

FIG. 3 is a schematic plan view for illustrating a top surface of the semiconductor light-receiving element 10B according to another example. FIG. 4 is a schematic sectional view taken along the line IV-IV of FIG. 3. The semiconductor light-receiving element 10B according to the example illustrated in FIG. 3 and FIG. 4 is a back-illuminated semiconductor light-receiving element in which light enters from a back side of a substrate 107B. Components of the semiconductor light-receiving element 10B that are common to the example illustrated in FIG. 1 and FIG. 2 are denoted by the same reference symbols, and descriptions thereof are omitted.

Differences from the example illustrated in FIG. 1 and FIG. 2 are the configuration of a light-receiving portion electrode 101B formed above the light-receiving mesa portion 110, the configuration of the back side of the substrate 107B, and the function of a passivation film 114B. The configuration of the back side of the substrate 107B includes a condenser lens 116 formed by an etching process. The light-receiving portion electrode 101B in the example illustrated in FIG. 3 and FIG. 4 has a circular shape, whereas the light-receiving portion electrode 101 in the example illustrated in FIG. 1 and FIG. 2 has a ring shape. More specifically, the outer circumference of a through-hole formed in the passivation film 114B on the top surface of the light-receiving mesa portion 110 defines the contour of the light-receiving portion electrode 101B, so that the light-receiving portion electrode 101B is formed also on a top surface of a portion of the passivation film 114B that is placed on the inner circumference side of the through-hole. The passivation film 114B in the example illustrated in FIG. 3 and FIG. 4 is a high-reflection film having a high reflectance, and is an insulating film as well. Part of light entering from the condenser lens 116, which is formed on the back side of the substrate 107B, is absorbed by the absorption layer 106 in the light-receiving mesa portion 110, and the rest of the light is transmitted. The light transmitted through the absorption layer 106 is reflected by the passivation film 114B or the light-receiving portion electrode 101B, and re-enters the absorption layer 106 to be absorbed and converted into electricity.

As in the example illustrated in FIG. 1 and FIG. 2, the bridge electrode 103 is formed in a layer separate from layers of the light-receiving portion electrode 101B and the pad electrode 102. The bridge electrode 103 has the second layer structure different from the first layer structure of the light-receiving portion electrode 101B. In the example illustrated in FIG. 3 and FIG. 4 also, the widening of the bridge electrode 103 can be inhibited, and the generation of parasitic capacitance between the bridge electrode 103 and the n-type contact layer 108 can be suppressed.

A semiconductor light-receiving element 10C according to still another example is described next with reference to FIG. 5.

Figure 5:
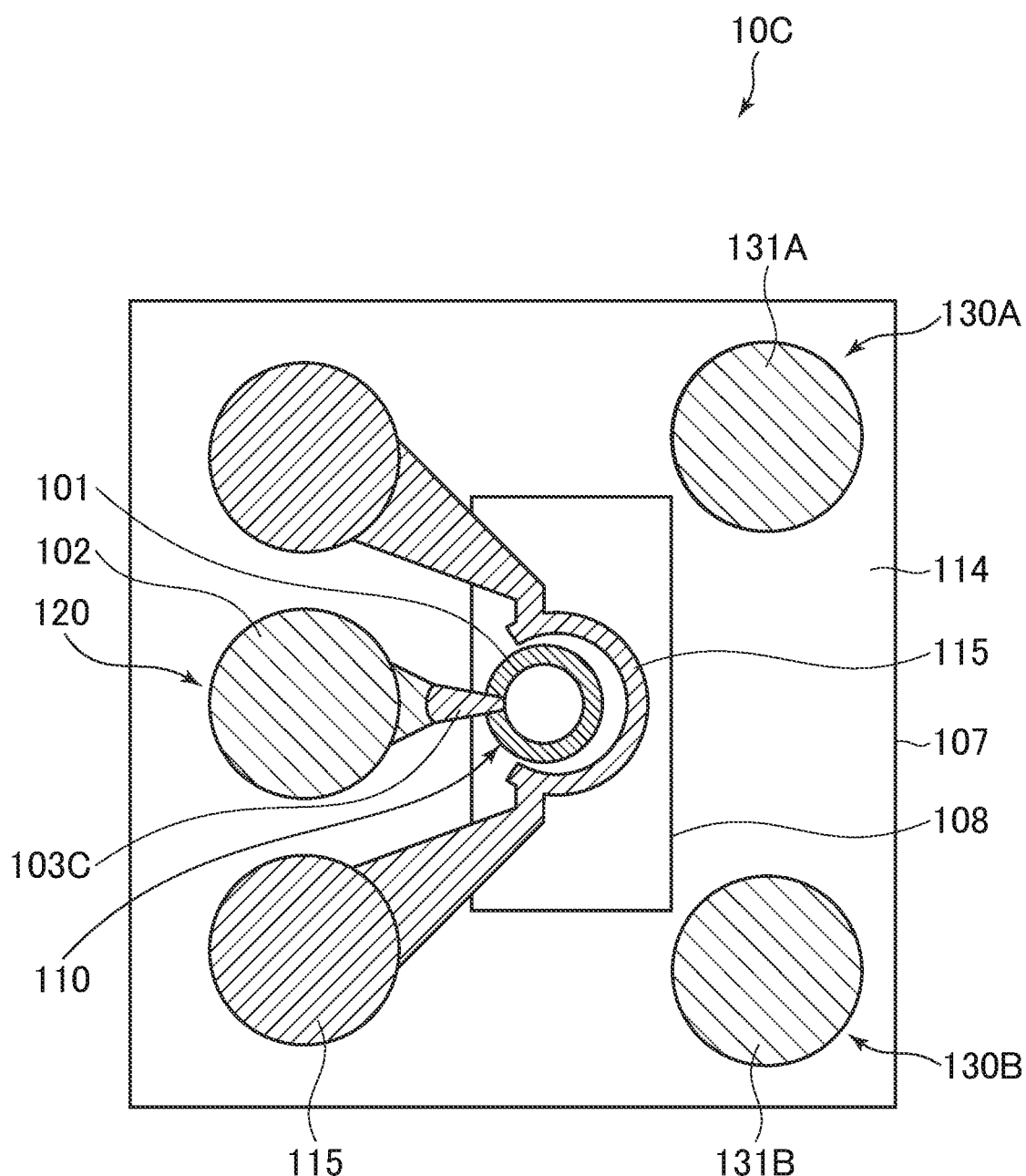
FIG. 5 is a schematic plan view for illustrating a top surface of a semiconductor light-receiving element according to an example.

FIG. 5 is a schematic plan view for illustrating a top surface of the semiconductor light-receiving element 10C according to still another example. Components of the semiconductor light-receiving element 10C that are common to the example illustrated in FIG. 1 and FIG. 2 are denoted by the same reference symbols, and descriptions thereof are omitted. The configuration of the example illustrated in FIG. 5 is the same as the configuration of the example illustrated in FIG. 1 and FIG. 2, except that a bridge electrode 103C has a different shape.

In the example illustrated in FIG. 5, the bridge electrode 103C does not have a constant width in a direction orthogonal to a direction in which the bridge electrode 103C stretches when viewed from above the substrate 107, and has a tapered shape that gradually widens as the distance to the pad electrode 102 decreases. This configuration improves connectivity to the pad electrode 102.

In the bridge electrode 103C having a tapered shape, the width of a region that overlaps with the n-type contact layer 108 when viewed from above the substrate 107 is set to 2 µm or more and 7 µm or less. This configuration suppresses the generation of parasitic capacitance between the bridge electrode 103C and the n-type contact layer 108.

In the descriptions of the examples given with reference to FIG. 1 to FIG. 5, the light-receiving mesa portion 110 includes the semi-insulating embedded layer 113, which is made of Fe—InP and placed so as to cover the side surfaces from the n-type buffer layer 109 to the p-type contact layer 112. The embedded layer 113 may be omitted. However, with the embedded electrode 113 placed in the light-receiving mesa portion 110, the bridge electrode 103 (or 103C) and the n-type contact layer 108 can be distanced from each other, which is effective in reducing parasitic capacitance. When the embedded layer 113 is not formed, on the other hand, the manufacturing process can be simplified, which is advantageous in reducing cost.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or,"

unless explicitly stated otherwise (e.g., if used in combination with "either" or "only one of").

What is claimed is:

1. A semiconductor light-receiving element comprising:
a substrate;
a light-receiving mesa portion, formed on top of the substrate, including a first semiconductor layer of a first conductivity type, an absorption layer, and a second semiconductor layer of a second conductivity type;
a light-receiving portion electrode, formed above the light-receiving mesa portion, connected to the first semiconductor layer;
a pad electrode formed on top of the substrate; and
a bridge electrode, placed so that an insulating gap is interposed between the bridge electrode and the second semiconductor layer, configured to connect the light-receiving portion electrode and the pad electrode on top of the substrate,
the bridge electrode being formed in a layer separate from layers of the light-receiving portion electrode and the pad electrode.

2. The semiconductor light-receiving element of claim 1, wherein the bride electrode and the pad electrode are connected at a point closer to the pad electrode than to a region in which the second semiconductor layer is placed when viewed from above the substrate.

3. The semiconductor light-receiving element of claim 1, further comprising:
a pad mesa portion interposed between the substrate and the pad electrode,
wherein the pad electrode, when viewed from above the substrate, is placed to stretch from a region in which the pad mesa portion is not placed, climb along a sloped surface of the pad mesa portion, and spread over a top surface of the pad mesa portion.

4. The semiconductor light-receiving element of claim 1, wherein the light-receiving portion electrode has a first layer structure including a plurality of metal layers, and
wherein the bridge electrode has a second layer structure that includes a plurality of metal layers,
the second layer structure being different than the first layer structure.

5. The semiconductor light-receiving element of claim 1, wherein the light-receiving portion electrode includes, in order from top downward, a first conducting electrode, a barrier electrode, and a first close contact electrode, and
wherein the bridge electrode includes, in order from top downward, a second conducting electrode and a second close contact electrode.

6. The semiconductor light-receiving element of claim 5, wherein the first close contact electrode and the second close contact electrode contain one element selected from the group consisting of Ti, W, Cr, Pd, and Ta,
wherein the barrier electrode contains one of Pt or Mo, and
wherein the first conducting electrode and the second conducting electrode contain Au.

7. The semiconductor light-receiving element of claim 6, wherein the first close contact electrode and the second close contact electrode contain Ti, and
wherein the barrier electrode contains Pt.

8. The semiconductor light-receiving element of claim 1, wherein the bridge electrode, when viewed from above the substrate, has a width of 2 μm or more and 7 μm or less in a direction orthogonal to a direction in which the bridge electrode stretches, in a region that overlaps with the light-receiving mesa portion.

9. The semiconductor light-receiving element of claim 1, wherein the bridge electrode, when viewed from above the substrate, has a contour that is a combination of at least one type of elements selected from straight lines, curved lines, and obtuse angles.

10. The semiconductor light-receiving element of claim 1, wherein the bridge electrode, when viewed from above the substrate, has a contour that is an inwardly closed shape.

11. A manufacturing method of a semiconductor light-receiving element comprising:
preparing a substrate;
forming a light-receiving mesa portion on top of the substrate,
the light-receiving mesa portion including a first semiconductor layer of a first conductivity type, an absorption layer, and a second semiconductor layer of a second conductivity type;
forming a light-receiving portion electrode above the light-receiving mesa portion,
the light-receiving portion electrode being connected to the first semiconductor layer;
forming a pad electrode on top of the substrate; and
forming a bridge electrode in a layer separate from layers of the light-receiving portion electrode and the pad electrode,
the bridge electrode being placed so that an insulating gap is interposed between the bridge electrode and the second semiconductor layer, and
the bridge electrode connecting the light-receiving portion electrode and the pad electrode on top of the substrate,
wherein the forming the bridge electrode includes:
forming a resist that has, when viewed from above the substrate, an opening in a region in which the bridge electrode is to be formed and an overhang portion on an inner side surface of the opening;
forming a metal film by vapor deposition on a top surface of the resist and in the region in which the bridge electrode is to be formed; and
removing the resist to remove a portion of the metal film that is formed on the top surface of the resist.

12. The manufacturing method of claim 11, wherein the bride electrode and the pad electrode are connected at a point closer to the pad electrode than to a region in which the second semiconductor layer is placed when viewed from above the substrate.

13. The manufacturing method of claim 11, wherein the pad electrode, when viewed from above the substrate, is placed to stretch from a region in which a pad mesa portion, interposed between the substrate and the pad electrode, is not placed, climb along a sloped surface of the pad mesa portion, and spread over a top surface of the pad mesa portion.

14. The manufacturing method of claim 11,
wherein the light-receiving portion electrode has a first layer structure including a plurality of metal layers, and
wherein the bridge electrode has a second layer structure that includes a plurality of metal layers,
the second layer structure being different than the first layer structure.

15. The manufacturing method of claim 11, wherein the light-receiving portion electrode includes, in order from top downward, a first conducting electrode, a barrier electrode, and a first close contact electrode, and wherein the bridge electrode includes, in order from top downward, a second conducting electrode and a second close contact electrode.

16. The manufacturing method of claim 15, wherein the first close contact electrode and the second close contact electrode contain one element selected from the group consisting of Ti, W, Cr, Pd, and Ta, wherein the barrier electrode contains one of Pt or Mo, and wherein the first conducting electrode and the second conducting electrode contain Au.

17. The manufacturing method of claim 16, wherein the first close contact electrode and the second close contact electrode contain Ti, and wherein the barrier electrode contains Pt.

18. The manufacturing method of claim 11, wherein the bridge electrode, when viewed from above the substrate, has a width of 2 μm or more and 7 μm or less in a direction orthogonal to a direction in which the bridge electrode stretches, in a region that overlaps with the light-receiving mesa portion.

19. The manufacturing method of claim 11, wherein the bridge electrode, when viewed from above the substrate, has a contour that is a combination of at least one type of elements selected from straight lines, curved lines, and obtuse angles.

20. The manufacturing method of claim 11, wherein the bridge electrode, when viewed from above the substrate, has a contour that is an inwardly closed shape.

* * * * *